US005578998A

United States Patent [19]
Kasprowicz

[11] Patent Number: 5,578,998
[45] Date of Patent: Nov. 26, 1996

[54] METHOD AND APPARATUS FOR PREDICTING OF LAMP FAILURE

[75] Inventor: Matthew H. Kasprowicz, Waterford, Mich.

[73] Assignee: Chivas Products Limited, Sterling Heights, Mich.

[21] Appl. No.: 406,680

[22] Filed: Mar. 20, 1995

[51] Int. Cl.⁶ .................................................. G08B 21/00
[52] U.S. Cl. ........................ 340/642; 340/458; 315/136; 315/131; 324/414; 324/525
[58] Field of Search .................................. 340/641, 642, 340/458; 315/129–136; 324/133, 403, 414, 522, 555, 556

[56] References Cited

U.S. PATENT DOCUMENTS

| | | |
|---|---|---|
| 2,548,991 | 4/1951 | McNabb . |
| 4,190,830 | 2/1980 | Bell .................................. 340/642 |
| 4,222,047 | 9/1980 | Finnegan ........................ 340/642 |
| 4,348,613 | 9/1982 | Hormel et al. ................. 340/642 |
| 4,550,303 | 10/1985 | Steele ............................. 340/641 |
| 4,700,172 | 10/1987 | Ishida et al. ................... 340/642 |
| 4,906,935 | 3/1990 | Hess et al. ..................... 324/415 |
| 5,008,626 | 4/1991 | Boyd, Sr. ....................... 340/641 |
| 5,057,814 | 10/1991 | Onan et al. .................... 340/642 |
| 5,075,669 | 12/1991 | Nakadozono et al. .......... 340/642 |
| 5,095,502 | 3/1992 | Finzel ............................. 340/641 |
| 5,202,636 | 4/1993 | Powell ............................ 340/641 |
| 5,323,116 | 6/1994 | Atria .............................. 340/653 |

*Primary Examiner*—Jeffery Hofsass
*Assistant Examiner*—Daniel J. Wu
*Attorney, Agent, or Firm*—Harness, Dickey & Pierce

[57] ABSTRACT

A method and apparatus for identifying electric lamps likely to fail due to a violated internal atmosphere monitor voltage through a resistor in order to ascertain a increasing internal resistance of the lamp. The apparatus of the present invention preferably includes a power supply and a resistor in series with the electric lamp. The apparatus further includes a data acquisition system for comparing a voltage drop across the resistor at a predetermined time with a predetermined minimum value. The method of the present invention utilizes the circuit of the apparatus and includes the steps of establishing a predetermined minimum value of voltage drop across the resistor for acceptable lamps, placing a test lamp in series with the battery and resistor, and supplying voltage to the test lamp for a test interval of time. The method further includes the steps of determining a voltage drop across the resistor at a predetermined time, comparing the voltage drop with the predetermined minimum value, and rejecting the lamp when the voltage drop is below the predetermined minimum value.

8 Claims, 1 Drawing Sheet

METHOD AND APPARATUS FOR PREDICTING OF LAMP FAILURE

BACKGROUND OF THE INVENTION

In general, the present invention relates to a method and apparatus for the detection of lamp failures. More particularly, the present invention relates to a method and system for the non-destructive testing of the integrity of the internal atmosphere of an incandescent lamps.

Incandescent lamps are typically manufactured with an evacuated internal atmosphere or an inert gas atmosphere. In situations where a leak develops in the lamp vacuum or the internal components of the lamp become contaminated during or after the manufacture of a lamp, the internal atmosphere within the lamp will become contaminated. The presence of oxygen around the hot filament of an electrical lamp results in a reaction between the oxygen and the tungsten of the lamp. As a result, oxidation forms on the lamp filament and collects on the inside of the glass bulb.

This condition of oxidation within the internal atmosphere of a bulb is commonly referred to as lamp "white out" because of a white film which collects within the lamp. In some instances, such a violation of the internal atmosphere of the lamp may immediately render the lamp inoperative. More commonly, the lamp initially appears fully operative. However, the lamp has a significantly shorter life span compared to a "good bulb". In many instances, a lamp with a contaminated internal atmosphere can remain operative for thirty (30) seconds or more before the filament breaks, thereby rendering the lamp inoperative. When a lamp whites out, the internal resistance of the lamp increases, while the current through the bulb correspondingly decreases.

Various types of lamp failure indicating devices have heretofore been proposed and utilized. Most prior known devices are directed towards arrangements operative for identifying completely inoperative (also referred to as burned out) lamps or bulbs. For example, U.S. Pat. No. 2,548,991 to McNabb, U.S. Pat. No. 4,222,047 to Finnegan, U.S. Pat. No. 4,348,613 to Hormel et al., and U.S. Pat. No. 5,008,626 to Boyd, disclose various devices operative for identifying burned out electrical lamps.

Generally, prior known devices such as those shown and described in the aforementioned patents apply current through a circuit to a test bulb. Failure of the lamp to complete the circuit serves to activate various forms of lamp failure indicating mechanisms.

While prior art devices have generally proven to be commercially acceptable for identifying complete bulb failure, most are not adapted to anticipate premature failure. More particularly, most are not adapted to anticipate premature failure of lamps which are initially operative as a result of a violated internal atmosphere.

For lamp applications where testing subsequent to installation is advantageous, prior known devices are unable to satisfactorily identify lamps which are initially operative, but which will prematurely fail. Some exemplary lamp applications include, but are not limited to, automotive vehicle applications for head lamps, stop lamps, tail lamps and the like. Subsequent to installation, lamps utilized in such applications are inaccessible without time consuming removal of parts.

U.S. Pat. No. 5,202,636 to Powell discloses a method for detecting lamp white outs. The method of Powell monitors the change in light output over a period of time by utilizing a focusing lens to impinge light emitted from an electrical lamp upon a phototransistor. Electrical output from the phototransistor is compared to the voltage applied to the lamp, and lamps are rejected if their increase light output lags behind the increase in applied voltage by more than a predetermined value. Disadvantageously, the method of Powell requires free access to the lamp.

While Powell is designed to detect lamps which may be subject to premature failure due to white out, it is also attendant with its own limitations. In this regard, isolation and focusing of the light emitted from a lamp is necessarily required. In lamp applications, such as the exemplary automotive applications discussed above, it is advantageous to test lamps after installation since occasionally the lamps are accidentally cracked during installation. The method of Powell is unable to test a lamp while operatively installed in a fixture such as a head light, tail light, or the like.

While previously known devices have proven to be relatively commercially acceptable for a wide range of applications, each is attended with drawbacks and/or inherent limitations, some of which have been discussed above. Most significantly, none of the prior known devices and techniques is operative to satisfactorily anticipate premature lamp failure by monitoring the internal resistance of the lamp over a short period of time. In addition, many prior devices and techniques are complex, cost prohibitive, or both.

Accordingly, it is a principal object of the method and apparatus of the present invention to provide a cost effective apparatus for verifying the integrity of electric lamps by monitoring the internal resistance of the lamps over a short time interval.

SUMMARY OF THE INVENTION

In a first aspect, the present invention is directed to an apparatus for testing an electric lamp of the type including an internal atmosphere. In the preferred embodiment, the apparatus includes a power supply for providing the electrical lamp with a source of power during a test interval of time. The power supply being electrically interconnected with the electrical lamp. The apparatus further includes a resistor in series with the power supply and the electric lamp. In the preferred embodiment, the apparatus of the present invention additionally includes a data acquisition system for comparing a drop in voltage across the resistor at a predetermined time with a predetermined minimum value.

In a second aspect, the present invention is directed to a method for detecting lamp failures. In a preferred form thereof, the method of the present invention comprises the steps of providing a circuit having a battery and a resistor in series and establishing a predetermined minimum value of voltage drop across the resistor for acceptable bulbs. The method of the present invention further includes the steps of placing a test lamp in series with the battery and resistor, supplying voltage to the test lamp for a test interval of time, determining a voltage drop across the resistor at a predetermined time, and comparing the voltage drop across the resistor at the predetermined time with the predetermined minimum value. In the preferred embodiment, the method of the present invention further includes rejecting the test lamp when the voltage drop across the resistor at the predetermined time is below the predetermined minimum value. Further, in the preferred embodiment, the step of establishing a predetermined minimum value of voltage drop across the resistor for acceptable lamps bulbs includes the steps of sequentially placing a plurality of good lamps in series with the battery resistor, and determining voltage drop across the resistor for each of the good lamps at the predetermined time.

BRIEF DESCRIPTION OF THE DRAWINGS

Further objects, features and advantages of the present invention will become apparent from analysis of the following written specification and the accompanying drawing and the appended claims in which:

DETAILED DESCRIPTION OF THE PREFERRED EMBODIMENT

Figure 1:
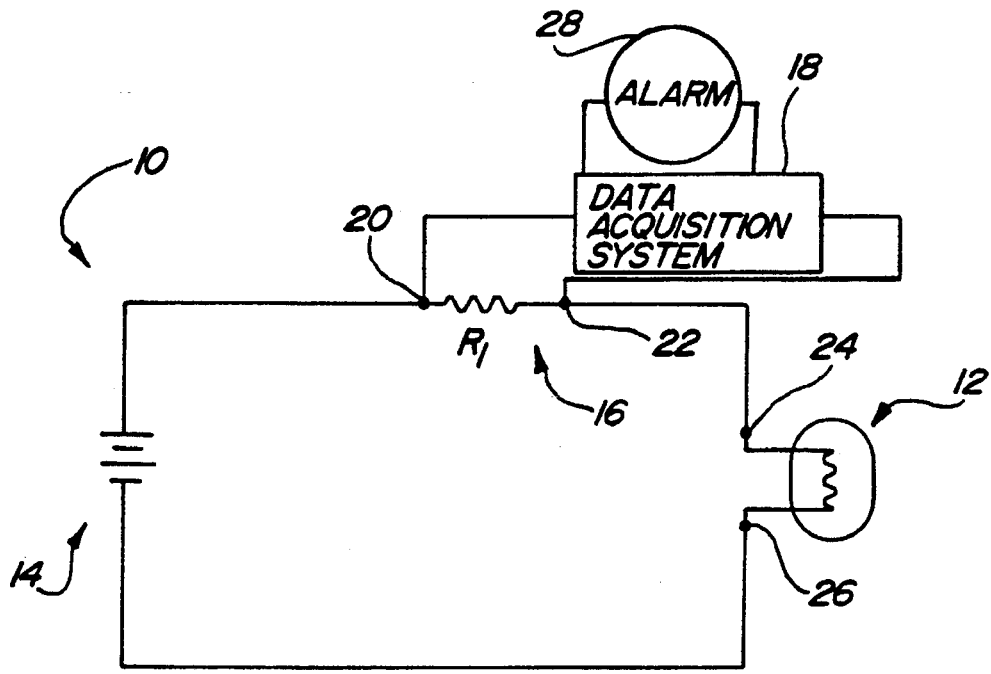
FIG. 1 is an electrical schematic diagram of a lamp failure indicating circuit embodying the teachings of a preferred embodiment of the present invention.

Referring to the drawings, where similar reference characters designate like elements, illustrated is a preferred embodiment of the present invention. It will be appreciated by those skilled in the art that the particular embodiment shown throughout the drawings is offered as an example which incorporates the teachings of the present invention, and is therefore merely exemplary and not intended to limit the scope of the appended claims.

With specific reference to FIG. 1, an apparatus is illustrated embodying the principles of the preferred embodiment of the present invention. The apparatus is shown to comprise a circuit 10 for detecting lamp failures. More particularly, the circuit 10 is operative for testing a test lamp 12 and is shown to include a power source 14 in the form of a battery and a resistor 16. In the exemplary embodiment illustrated, the battery 14 and resistor 16 are in series with the test lamp 12. Further in the preferred embodiment, the circuit 10 includes a data acquisition system 18 connected across resistor 16 at terminals 20 and 22.

In the schematic diagram of the circuit 10 of FIG. 1, the interconnection of lamp 12 has been simplified and is represented as a direct connection of the test lamp 12 to a pair of terminals 24, 26. However, it will be appreciated by those skilled in the art that in actual practice, the circuit 10 can be connected to an electrically conductive lamp housing or socket (not shown) for the test lamp 12 to provide for quick and easy removal and replacement of lamps. It will also be appreciated that an alternating current power source could be utilized together with conventional rectification circuitry if so desired. In one exemplary use, the circuit 10 is electrically connected to the wiring leading into a vehicle liftgate housing (not shown) for testing of the lamps operatively mounted within the housing. Alternatively, a test fixture (not shown) can be utilized for testing of lamps prior to installation.

In one exemplary application, the battery 14 provides approximately 13.8 volts. Further in this exemplary application, the resistor 16 is a 1 ohm resistor. It will be readily appreciated by those skilled in the art that the voltage level of the battery 14 and the resistance level of the resistor 16 are both subject to modification without departure from the scope of the present invention. According to the principle of Ohm's law (v=ir), the total of the voltage drops across the elements of the circuit 10 is equal to the current flowing through the circuit 10 multiplied by the sum of collective resistances of the individual elements of the circuit 10. Thus, incorporation of the 1 ohm resistor 16 renders the voltage across the resistor 16 directly related to the current through the circuit 10.

The data acquisition system 18 is operative for collecting data concerning the voltage drop of the circuit 10 across the resistor 16. In the preferred embodiment, the data acquisition system 18 comprises a programmable logic controller (not specifically shown) equipped with an analog input card. One suitable programmable logic controller is commercially available from Allen-Bradley of Milwaukee, Wis. as a Slick 500 Programmable Logic Controller. One suitable analog input card is commercially available from Allen-Bradley as Part No. 1746-N14. Further in the preferred embodiment, the data acquisition system 18 includes an alarm 28 for providing a signal to a user when the data acquisition system 18 detects a failed lamp 12.

The method of the present invention is specifically adapted for testing the internal atmosphere of an electric lamp 12. In a preferred form, the method of the present invention includes the steps of (1) establishing a predetermined minimum value of voltage drop across a resistor for acceptable lamps; (2) placing a test lamp 12 in series with the resistor 16 and a battery 14; (3) supplying a source of voltage to the electrical lamp 12 for a test interval of time; (4) determining a voltage drop across the resistor at the end of the test time interval; and (5) rejecting the test lamp 12 when the voltage drop across the resistor 16 at the predetermined time is below the predetermined minimum value.

In an alternative form of the method of the present invention, a bench mark value of acceptable change in internal resistance of the lamp 12 is established by supplying current to a plurality of a good lamps 12 for a predetermined period of time. Subsequently, a test lamp 12 is placed into the circuit 10 and the change in resistance of the lamp 12 is monitored by determining the drop in voltage over the resistor 16 at the start of the test period and at the end of the test period. Lamps 12 are rejected where the change in voltage drop from the start of the test period to the end of the test period is above an acceptable bench mark value for good lamps, thus indicating that the internal resistance of the lamp 12 is increasing and the lamp is very likely to white out.

Figure 2:
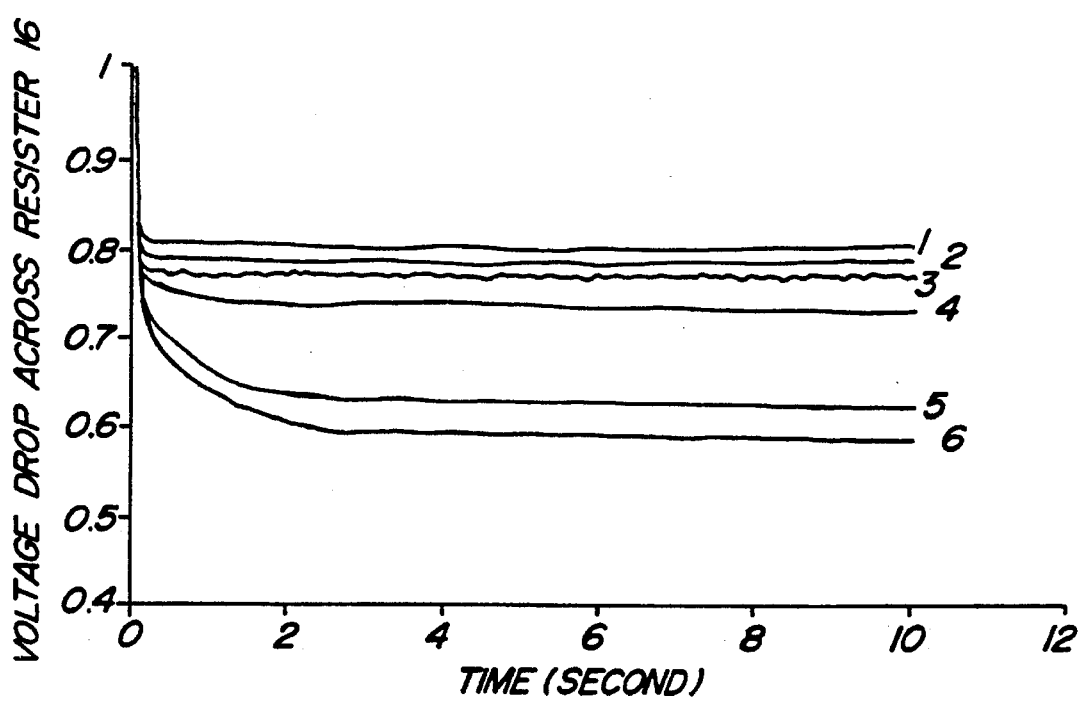
FIG. 2 is a representative graph illustrating the experimental results from tests performed using the method and apparatus of the present invention showing the voltage across the resistor of FIG. 1 as a function of time.

Referring to FIG. 2, a representative graph is illustrated showing the voltage drop across the resistor 16 as a function of time (seconds) from experimental test results using the circuit 10 of the present invention. The representation graph of FIG. 2 includes lines representing maximum, average and minimum voltage drops across resistor 16 for both good lamps and white out lamps (i.e., lamps likely to fail prematurely).

The lines of FIG. 2 are designated as follows: (1) maximum voltage drop across resistor 16 for good lamps; (2) average voltage drop across resistor 16 for good lamps; (3) minimum voltage drop across resistor 16 for good lamps; (4) maximum voltage drop across resistor 16 for white out lamps; (5) average voltage drop across resistor 16 for white out lamps; and (6) minimum voltage drop across resistor 16 for white out lamps. The experimental test results were obtained from a test involving forty-six (46) lamps 12. Using pliers, twenty-six (26) of the lamps were intentionally damaged. In this regard, the ends of twenty-six (26) of the lamps 12 were fractured. The remaining twenty (20) lamps 12 were not subject to intentional damage.

One at a time, current was provided by the battery 14 to each of the lamps 12. The data acquisition system 18 took readings of the voltage drop across resistor 16 at a rate twenty (20) times per second for a test period of ten (10)

seconds. Of the twenty-six (26) damaged lamps 12, four (4) burned out prior to expiration of the ten (10) second test period. Three (3) of the lamps 12 did not white out because the seal of the lamp 12 was not broken and the internal atmosphere was not violated. Nineteen (19) of the lamps 12 whited out. All white out lamps 12 remained operational after the ten (10) second test interval elapsed.

Omitting initial readings due to a power spike resulting from turning on the battery 14, Table 1 set forth immediately below provides maximum and minimum voltage readings across resistor 16 for both good lamps and white out lamps.

TABLE 1

| Reading | Voltage (volts) |
| --- | --- |
| Max. across $R_1$ for good lamps | 0.804 |
| Min. arcoss $R_1$ for good lamps | 0.767 |
| Max. across $R_1$ for white out lamps | 0.743 |
| Min. across $R_1$ for white out lamps | 0.583 |

From the above table, it can be seen that a measurable difference of 0.024 volts or more existed between the defective lamps and the good lamps. From the graph of FIG. 2, it can be seen that an ascertainable difference exists within one second of testing and stabilizes within approximately two seconds. This voltage drop across the resistor 16 correlates directly to a drop in current in the circuit 10 from which it can be deduced that a lamp 12 likely to fail prematurely is being tested. The minimum voltage drop across the resistor 16 for good lamps is used to establish a predetermined minimum value. The voltage drop across resistor 16 for test lamps 12 is compared to this predetermined minimum value.

Accordingly, by simply monitoring the voltage across the resistor 16 and comparing the minimum value measured during the test time interval and comparing the minimum value with a predetermined value presenting a minimum threshold value for a good lamp, it can be determined whether the lamp 12 being tested is very likely to fail prematurely. There is thus provided by the method and apparatus of the present invention a means for testing the internal atmosphere of an electric lamp 12.

The foregoing discussion discloses and describes merely an exemplary embodiment of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A lamp testing apparatus for testing an electrical lamp to predict whether the electrical lamp is likely to white-out, the apparatus comprising:

a power supply for providing the electrical lamp with a source of power during a test interval of time, the power supply being electrically interconnected with the electrical lamp;

a resistor in series with the power supply and the electrical lamp; and a data acquisition system for measuring a voltage drop across said resistor for said test time interval to determine a measured, minimum voltage drop across said resistor at the end of said test time interval, and comparing said minimum voltage drop across the resistor with a predetermined minimum voltage value in order to predict whether the electrical lamp is likely to white-out.

2. The lamp testing apparatus of claim 1, further comprising an alarm mechanism for providing a failure indication such that the alarm mechanism is activated when the voltage drop across the resistor at the predetermined time is below the predetermined minimum value.

3. The lamp testing apparatus of claim 1, wherein the power supply is a constant voltage power supply.

4. The lamp testing apparatus of claim 2, wherein the test interval of time is approximately ten seconds or less.

5. A lamp testing apparatus for testing an electrical lamp of the type including an internal atmosphere to determine whether the internal atmosphere has been violated, to thereby predict whether the lamp is likely to prematurely tail, the apparatus comprising:

a power supply for providing the lamp with a source of power during a test interval of time;

a resistor in series with the power supply and the lamp;

a data acquisition system for measuring a voltage drop across said resistor for said test time interval to determine a measure, minimum voltage drop across said resistor at the end of said test time interval, and comparing said minimum voltage drop across the resistor with a predetermined minimum voltage value; and an alarm mechanism for providing a failure indication such that the alarm mechanism is activated when the minimum voltage drop across the resistor is below the predetermined minimum voltage value in order to predict whether the lamp is likely to prematurely fail.

6. The lamp testing apparatus of claim 5, wherein the test interval of time is approximately ten seconds or less.

7. A method of testing an internal atmosphere of an electrical lamp to predict whether the lamp is likely to white-out, the method comprising the steps of:

providing a circuit having battery and a resistor in series;

establishing a predetermined minimum value of voltage drop across the resistor for acceptable lamps;

placing a test lamp in series with the battery and resistor;

applying voltage to the test lamp for a time interval;

determining a minimum voltage drop across the resistor at the expiration of said time interval;

comparing the minimum voltage drop across the resistor at the expiration of said time interval with the predetermined minimum value of voltage drop; and rejecting the test lamp when the minimum voltage drop across the resistor at the expiration of said time interval is below the predetermined minimum value of voltage drop whereas to predict whether the test lamp is likely to white-out.

8. The method of claim 7, wherein the step of establishing a predetermined minimum value of voltage drop across the resistor for acceptable lamps includes the steps of:

sequentially placing a plurality of good lamps in series with the battery and resistor; and determining voltage drop across the resistor for each of the good lamps at a predetermined time.

* * * * *